US007501973B2

(12) United States Patent
Choi et al.

(10) Patent No.: US 7,501,973 B2
(45) Date of Patent: Mar. 10, 2009

(54) HIGH-RESOLUTION TIME-TO-DIGITAL CONVERTER

(75) Inventors: Hyoung-Chul Choi, Suwon-si (KR); Seong-Hwan Cho, Daejeon (KR); Soh-Myung Ha, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 11/940,589

(22) Filed: Nov. 15, 2007

(65) Prior Publication Data

US 2008/0136698 A1 Jun. 12, 2008

(30) Foreign Application Priority Data

Nov. 15, 2006 (KR) ...................... 10-2006-0112707

(51) Int. Cl.
*H03M 1/50* (2006.01)
*H03H 11/26* (2006.01)

(52) U.S. Cl. ....................... 341/166; 327/269; 327/271; 327/284

(58) Field of Classification Search ................. 341/157, 341/166; 327/261, 262, 263, 269, 270, 276, 327/277, 284; 702/79, 176
See application file for complete search history.

(56) References Cited

U.S. PATENT DOCUMENTS 4,866,502 A * 9/1989 Tomaszewski et al. ...... 257/533
5,374,860 A * 12/1994 Llewellyn ................... 327/276
5,994,924 A * 11/1999 Lee et al. ....................... 326/93
6,144,224 A * 11/2000 Lee et al. ....................... 326/93
6,754,613 B2 6/2004 Tabatabaei et al.
2008/0129574 A1* 6/2008 Choi et al. .................. 341/166

FOREIGN PATENT DOCUMENTS

JP 11-031952 2/1999
KR 2002-15691 2/2002

OTHER PUBLICATIONS

Yang, C. et al., RC-Delay Chain-Based RF Time to Digital Converter, IEEE International Conference on Mechatronics and Automation, Jun. 2006, pp. 1543-1547.*
Mota, M. et al. A High-Resoulution Time INterpolator based on a Delay Locked Loop and an RC Delay Line, IEEE Journal of Solid State Circuits, vol. 34, No. 10, Oct. 1999, pp. 1360-1366.*

* cited by examiner

*Primary Examiner*—Howard Williams
(74) *Attorney, Agent, or Firm*—F. Chau & Assoc., LLC

(57) ABSTRACT

A time-to-digital converter includes a first delay line, a second delay line, comparators, and an encoder. The first delay line includes first resistors coupled in series and receives a first signal through a start node. The second delay line includes second resistors coupled in series and receives a second signal through a node corresponding to an end node of the first delay line. The comparators compare first voltages of nodes on the first delay line with second voltages of corresponding nodes on the second delay line. The encoder generates a digital code based on outputs of the comparators. Therefore, the time-to-digital converter may decrease a chip size thereof and lower power consumption, and the time-to-digital converter may increase a range of a maximum delay time between two signals.

38 Claims, 11 Drawing Sheets

HIGH-RESOLUTION TIME-TO-DIGITAL CONVERTER

CROSS-REFERENCE TO RELATED APPLICATION

This application claims priority under 35 USC § 119 to Korean Patent Application No. 2006-112707 filed on Nov. 15, 2006 in the Korean Intellectual Property Office (KIPO), the disclosure of which is incorporated herein in its entirety by reference.

BACKGROUND OF THE INVENTION

1. Technical Field

The present disclosure relates to a high-resolution time-to-digital converter.

2. Discussion of Related Art

A time-to-digital converter (TDC) is used to measure a time difference between a standard signal and a comparison signal. Conventionally, the TDC is used in a laser range finder, and recently the TDC is used in an all-digital phase locked loop (ADPLL).

FIG. 1 is a diagram illustrating a conventional TDC including a signal delay line.

Referring to FIG. 1, the TDC 100 includes a delay line 110 transmitting a first signal, a standard line 120 transmitting a second signal, and comparators 130. The comparators 130 compare voltages of nodes on the delay line 110 with voltages of nodes on the standard line 120. The voltages of nodes on the standard line 120 correspond to the voltages of nodes on the delay line 110, respectively.

A time difference between the first signal and the second signal may be calculated from output signals of the comparators 130.

Each of the delay elements DELAY of the delay line 110 is usually implemented with an inverter, and a delay time of such inverter is about 50 picoseconds. Therefore, the TDC 100 in FIG. 1 may have a resolution of about 50 picoseconds.

The resolution of a TDC is required to be increased in order to implement a high-frequency ADPLL.

FIG. 2 is a diagram illustrating a conventional TDC including a vernier delay line.

The TDC 200 in FIG. 2 differs from the TDC 100 in FIG. 1 in that the TDC 200 in FIG. 2 includes two delay lines 210 and 220. There is a difference between a delay time of a delay element DELAY in the first delay line 210 and a delay time of a delay element DELAY in the second delay line 220. For example, the delay time of the delay element in the first delay line 210 may be about 50 picoseconds and the delay time of the delay element in the second delay line 220 may be about 60 picoseconds.

Therefore, the TDC 200 may have a resolution of about 10 picoseconds.

As described above, a TDC including a vernier delay line may have a higher resolution than a TDC including a single delay line. A relatively large chip size, however, is required to implement the TDC including the vernier delay line. Also, the TDC including the vernier delay line has a narrow range of maximum delay time between two signals, and the TDC including the vernier delay line needs much more power than the TDC having only the single delay line.

SUMMARY OF THE INVENTION

Accordingly, exemplary embodiments the present invention are provided to substantially obviate one or more problems due to limitations and disadvantages of the related art.

Exemplary embodiments of the present invention provide a high-resolution TDC occupying a small chip size, capable of increasing a range of a maximum delay time between two signals, and capable of decreasing power consumption.

In exemplary embodiments of the present invention, a time-to-digital converter includes a first delay line, a second delay line, comparators, and an encoder.

The first delay line includes first resistors coupled in series and receives a first signal through a start node. The second delay line includes second resistors coupled in series and receives a second signal through a node corresponding to an end node of the first delay line. The comparators compare first voltages of nodes on the first delay line with corresponding second voltages of nodes on the second delay line. The encoder generates a digital code based on outputs of the comparators.

Resistances of the first resistors and the second resistors may be substantially identical to each other.

The first resistors and the second resistors may be implemented with metal lines and via plugs.

The first resistors and the second resistors are implemented with poly-silicon resistors coupled in parallel.

Each resistance of the first resistors and second resistors corresponds to about several ohms.

The time-to-digital converter may further include a shielding line configured to protect the first delay line and the second delay line from noise.

Resolution control capacitor banks may be respectively coupled to the nodes on the first delay line and the second delay line.

The capacitor bank includes first through N-th capacitance units coupled in parallel and each of the capacitance units may include a capacitor and a switch.

A capacitance (Ck) of a capacitor in a K-th capacitance unit may satisfy Ck=2(K−1)*C1, where K is a natural number equal to or greater than 1 and equal to or less than N, and C1 corresponds to a capacitance of a capacitor in a first capacitance unit.

Delay time compensation units may be respectively coupled to at least a portion of the nodes on the first and second delay lines, and the delay time compensation unit may compensate an unbalance of a delay time between the nodes.

The delay time compensation unit may include one or more capacitors and one or more switches.

Resolution control capacitor banks are respectively coupled to the nodes on the first delay line and the second delay line.

In exemplary embodiments of the present invention, a time-to-digital converter includes a first delay line, a second delay line, comparators, and an encoder. The first delay line includes first resistors coupled in series and receives a first signal through a start node. The second delay line includes second resistors coupled in series and receives a second signal through a node corresponding to the start node. The comparators compare first voltages of nodes on the first delay line with second voltages of corresponding nodes on the second delay line. The encoder generates a digital code based on outputs of the comparators.

Each resistance of the first resistors may correspond to a first value, and each resistance of the second resistors may correspond to a second value different from the first value.

The first resistors and the second resistors may be implemented with metal lines and contact plugs.

Each resistance value of the first resistors and the second resistors may correspond to about several ohms.

Resolution control capacitor banks may be respectively coupled to the nodes of the first delay line and the second delay line.

The capacitor bank includes first through N-th capacitance units coupled in parallel and each of the capacitance units may include a capacitor and a switch.

A capacitance (Ck) of a capacitor in a K-th capacitance unit may satisfy Ck=2(K−1)*C1, where K is a natural number equal to or greater than 1 and equal to or less than N, and C1 corresponds to a capacitance of a capacitor in a first capacitance unit.

Delay time compensation units may be respectively coupled to at least a portion of the nodes of the first and second delay lines, and the delay time compensation unit may compensate an unbalance of the delay time between the nodes.

The delay time compensation unit may include one or more capacitors and one or more switches.

Resolution control capacitor banks may be respectively coupled to the nodes of the first and second delay lines, and the capacitor bank may control a resolution of the converter.

In exemplary embodiments of the present invention, a time-to-digital converter includes a first delay line, a second delay line, comparators, and an encoder.

The first delay line includes first resistors coupled in series and transmits a first signal. The second delay line includes second resistors coupled in series and transmits a second signal. The comparators are coupled between the first delay line and the second delay line, and the comparators compare first voltages of the nodes of the first delay line with second voltages of corresponding nodes of the second delay line. The encoder generates a digital code based on outputs of the comparators.

A layout of each of the comparators may have a symmetry with respect to the first delay line and the second delay line.

The first delay line may receive the first signal through a start node, and the second delay line may receive the second signal through a node corresponding to an end node of the first delay line.

Each resistance value of the first resistors and the second resistors may be substantially identical to each other.

The first delay line may receive the first signal through a start node, and the second delay line may receive the second signal through a node corresponding to the start node of the first delay line.

Each resistance value of the first resistors may correspond to a first value, and each resistance of the second resistors may correspond to a second value different from the first value.

The first resistors and the second resistors may be implemented with metal lines and via plugs.

The first resistors and the second resistors may be implemented with poly-silicon resistors coupled in parallel.

Each resistance value of the first resistors and the second resistors may correspond to about several ohms.

The time-to-digital converter may further include a shielding line configured to protect the first delay line and the second delay line from adverse effects caused by noise.

Resolution control capacitor banks may be respectively coupled to nodes of the first delay line and the second delay line.

The capacitor bank may include first through N-th capacitance units coupled in parallel and each of the capacitance unit may include a capacitor and a switch.

A capacitance (Ck) of a capacitor in a K-th capacitance unit may satisfy Ck=2(K−1)*C1, where K is a natural number equal to or greater than 1 and equal to or less than N, and C1 corresponds to a capacitance of a capacitor in a first capacitance unit.

Delay time compensation units may be respectively coupled to at least a portion of the nodes of the first and second delay lines and the delay time compensation unit may compensate an unbalance of a delay time between the nodes.

The delay time compensation unit may include one or more capacitors and one or more switches.

The resolution control capacitor banks may be respectively coupled to the nodes of the first delay line and the second delay line.

Therefore, a time-to-digital converter according to exemplary embodiments of the present invention may be implemented with smaller size and may consume lower power than a conventional time-to-digital converter. Also, a time-to-digital converter according to exemplary embodiments of the present invention may control a resolution from about 1 picoseconds to about 9 picoseconds.

BRIEF DESCRIPTION OF THE DRAWINGS

Exemplary embodiments of the present invention will be understood in more detail from the following descriptions taken in conjunction with the accompanying drawings.

DESCRIPTION OF EXEMPLARY EMBODIMENTS

Figure 1:
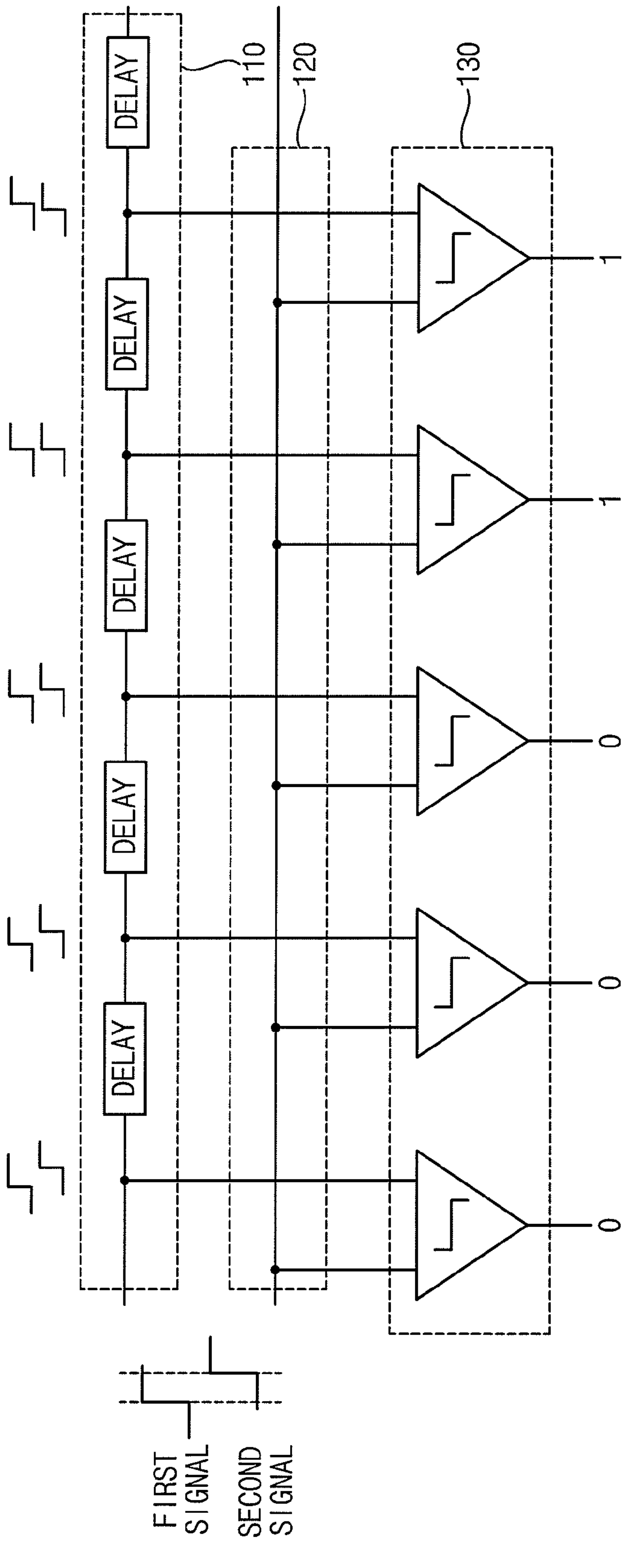
FIG.1 (CONVENTIONAL ART)
FIG. 1 is a diagram illustrating a conventional time-to-digital converter including a signal delay line.
Figure 2:
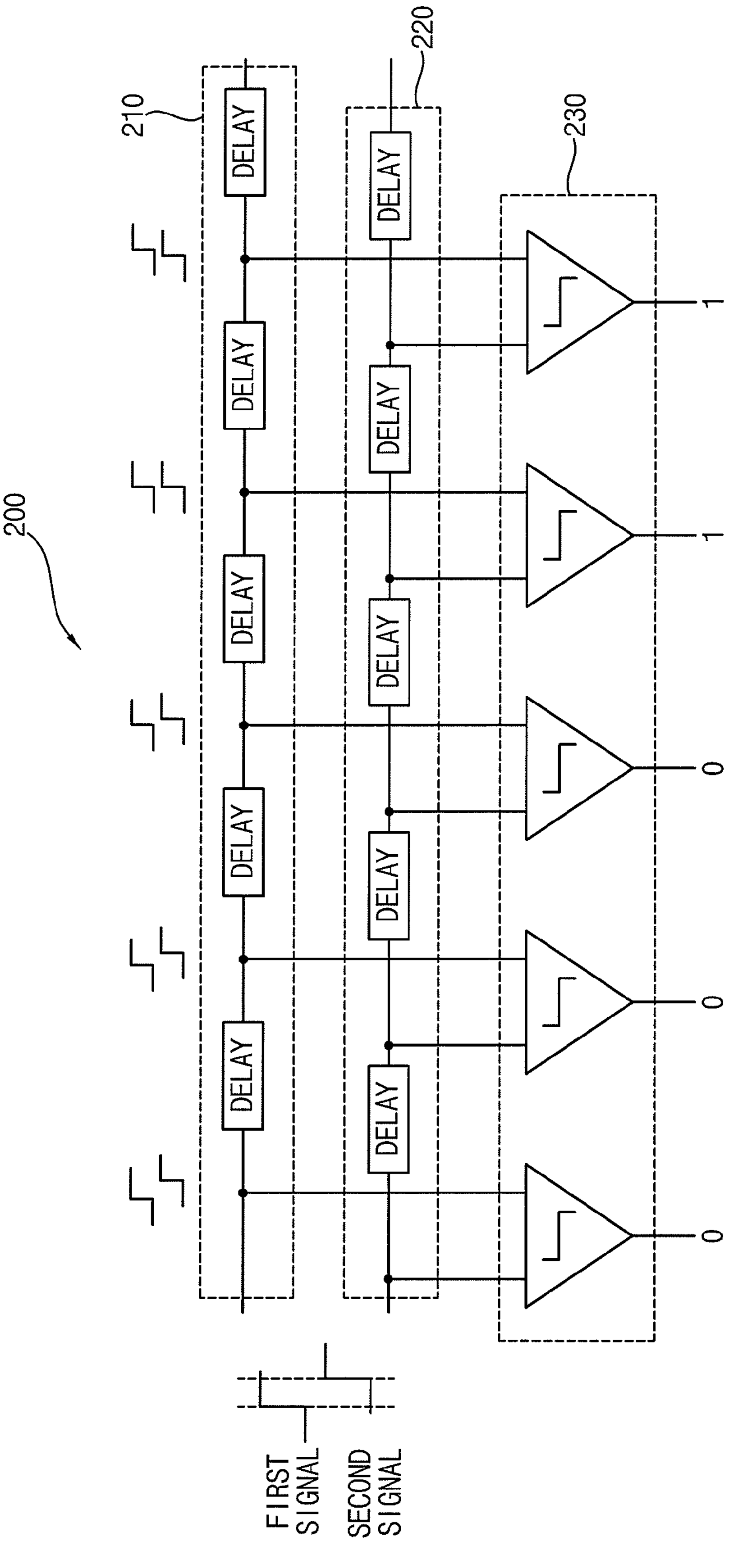
FIG.2 (CONVENTIONAL ART)
FIG. 2 is a diagram illustrating a conventional time-to-digital converter including a vernier delay line.

Exemplary embodiments of the present invention now will be described more fully with reference to the accompanying drawings, in which exemplary embodiments of the invention are shown. This invention may, however, be embodied in many different forms and should not be construed as limited to the exemplary embodiments set forth herein. Rather, these exemplary embodiments are provided so that this disclosure will be thorough and complete, and will fully convey the scope of the invention to those of ordinary skill in the art. Like reference numerals refer to like elements throughout this application.

Figure 3:
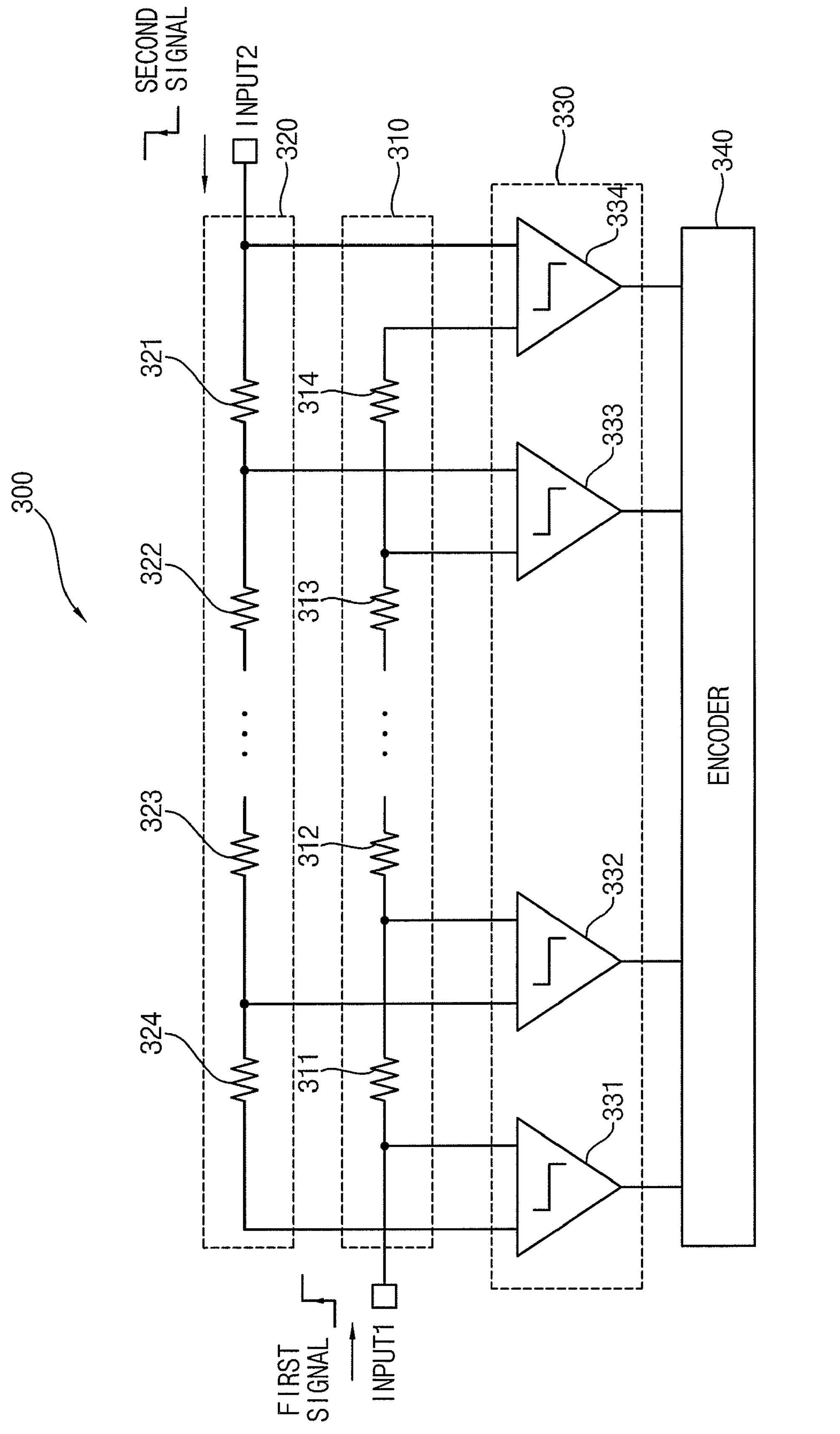
FIG. 3 is a diagram illustrating a high-resolution time-to-digital converter according to an exemplary embodiment of the present invention.

FIG. 3 is a diagram illustrating a high-resolution time-to-digital converter (TDC) according to an exemplary embodiment of the present invention. The TDC 300 includes two delay lines 310 and 320, comparators 330 and an encoder 340. The delay lines 310 and 320 respectively include resistors. A first signal is inputted to a start node at INPUT 1 of the first delay line 310 and transmitted to an end node of the first delay line 310 through resistors 311, 312, 313, and 314. A second signal is inputted at INPUT 2 to a node of the second delay line 320 corresponding to the end node of the first delay line 310 and transmitted to a node of the second delay line 320 corresponding to the start node of the first delay line 310 through resistors 321, 322, 323, and 324.

Resistances of the resistors 311, 312, 313, and 314 of the first delay line 310 and the resistors 321, 322, 323, and 324 of the second delay line 320 are substantially identical to each other. A direction of inputting the first signal to the first delay line is different from a direction of inputting the second signal to the second delay line, so as to decrease an unbalance of a delay time between start and end nodes.

A delay time when the first signal passes through the resistor 311 is longer than a delay time when the first signal passes through the resistor 312. Likewise, a delay time when the first signal passes through the resistor 312 is longer than a delay time when the first signal passes through the resistor 313, and a delay time when the first signal passes through the resistor 313 is longer than a delay time when the first signal passes through the resistor 314.

On the other hand, a delay time when the second signal passes through the resistor 321 is longer than a delay time when the second signal passes through the resistor 322. Likewise, a delay time when the second signal passes through the resistor 322 is longer than a delay time when the second signal passes through the resistor 323, and a delay time when the second signal passes through the resistor 323 is longer than a delay time when the second signal passes through the resistor 324.

The unbalance of delay times between the nodes is decreased because the direction of inputting the first signal is different from the direction of inputting the second signal.

The comparators 330 compare first voltages of nodes of the first delay line 310 with second voltages of corresponding nodes of the second delay line 320. The comparator 331 compares a voltage of the start node of the first delay line 310 with a voltage of an end node of the second delay line 320, the comparator 332 compares a voltage of a node between the resistor 311 and the resistor 312 with a voltage of a node between the resistor 324 and the resistor 323, the comparator 333 compares a voltage of a node between the resistor 313 and the resistor 314 with a voltage of a node between the resistor 322 and the resistor 321, and the comparator 334 compares a voltage of the end node of the first delay line 310 with a voltage of a start node of the second delay line 320.

Outputs of the comparators 330 are provided to the encoder 340, and the encoder 340 generates a digital code corresponding to a delay time of the first signal and the second signal. For example, the encoder 340 may generate a binary code corresponding to the delay time of the first signal and the second signal as the digital code.

Each resistance of the resistors of the delay lines is required to be about several ohms so as to implement a TDC having a resolution of about 1 picoseconds. Generally, a resistance of a resistor provided from a semiconductor manufacturing process is about several hundred ohms, and a resistor of several ohms may be obtained by connecting resistors of several hundred ohms in parallel. When a delay line is implemented with the resistor obtained by connecting the resistors of several hundred ohms in parallel, however, a size of the delay line is considerably increased.

Figure 4:
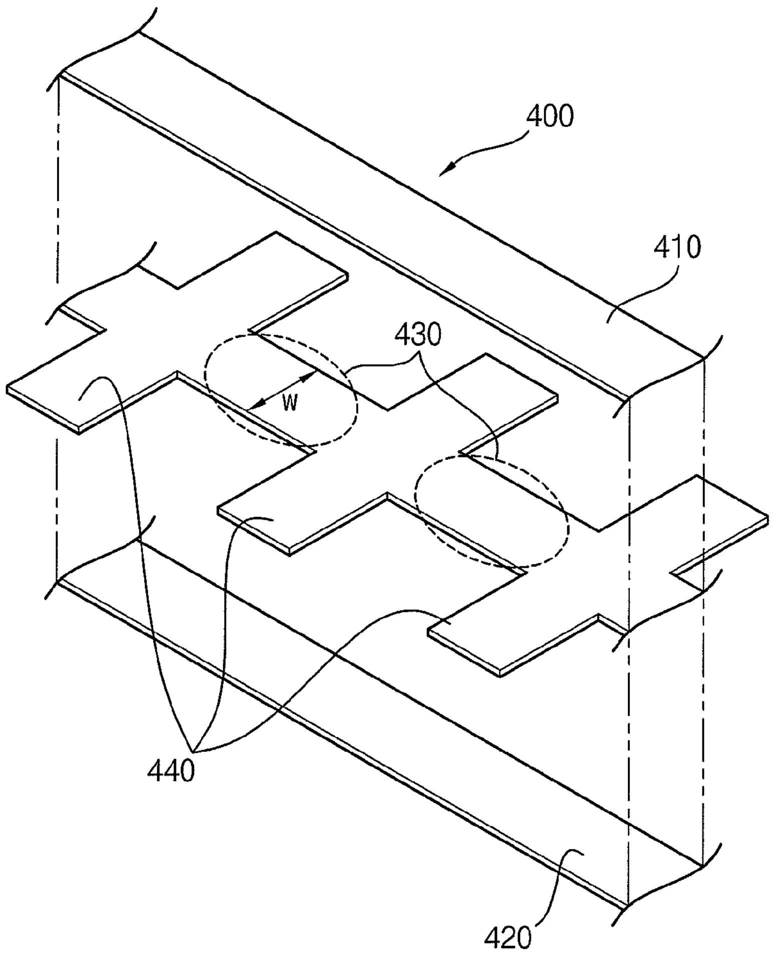
FIG. 4 is a diagram illustrating an example of a resistor that may be employed in the high-resolution time-to-digital converter shown in FIG. 3.
Figure 5:
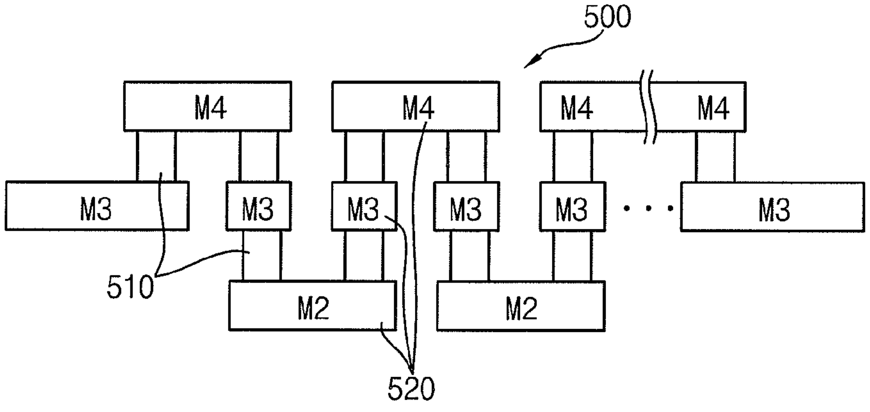
FIG. 5 is a diagram illustrating another example of a resistor.

FIGS. 4 and 5 are diagrams illustrating examples of a resistor having a small resistance and a small size, which may be employed in the high-resolution time-to-digital converter in FIG. 3.

Referring to FIG. 4, resistors of a delay line are implemented with a metal line.

The delay line 400 includes three metal layers. A metal line of a middle metal layer includes resistors 430 and nodes 440 for connection to the comparators. Resistances of the resistors 430 may be determined according to a width W of the metal line.

When the width W of the metal line is narrow, the resistances of the resistors 430 are large, and when the width W of the metal line is wide, the resistances of the resistors 430 are small. The nodes 440 are respectively coupled to input terminals of the comparators through via plugs or contact plugs. The via plugs or contact plugs are coupled in parallel so as to decrease a respective resistance between each of the nodes and each of the input terminals of the comparators.

A metal line 410 and a metal line 420 are coupled to a ground voltage to prevent adverse effects from external noise.

Referring to FIG. 5, resistors on a delay line are implemented with via plugs coupled in series.

In FIG. 5, one resistor may be implemented by using three metal layers. M2 is a metal layer above a lowest metal layer (not shown), M3 is a metal layer above the layer M2, and M4 is a metal layer above the layer M3.

A resistance of a resistor 500 is determined mainly by the via plugs 510 since a resistance of a metal line 520 is much smaller than that of the via plugs 510. When a resistance of a via plug is about 1 ohm, a resistor of about 3 ohms may be implemented by connecting three via plugs in series. Accurately controlling a resistance value may be difficult, however, because a resistance of a via plug may be changed according to a position of the via plug. To adjust the resistance value, for example, a resistor of about 3 ohms may be implemented by forming a unit resistor connecting 21 via plugs in series, and by connecting 7 unit resistors in parallel. A delay line may be implemented by connecting in series a plurality of resistors formed as described above.

The delay line of FIG. 5 may include two metal lines (not shown), that is, a metal line in a metal layer (not shown) just under layer M2 and a metal line in a metal layer just above layer M4 for preventing adverse effects from external noise as in the delay line 400 of FIG. 4.

Figure 6:
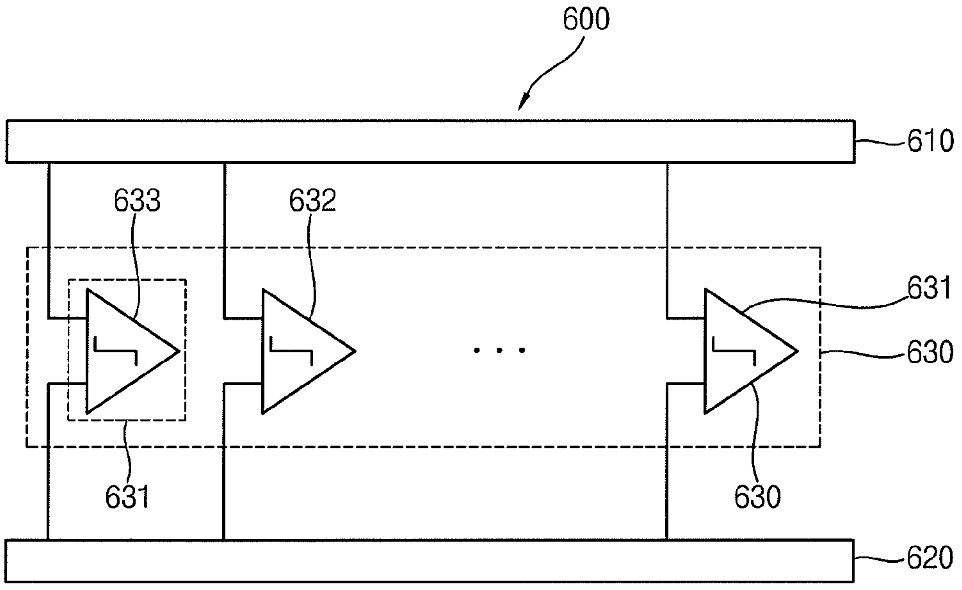
FIG. 6 is a diagram illustrating a layout of comparators and delay lines.

FIG. 6 is a diagram illustrating a layout of comparators and delay lines.

Referring to FIG. 6, a TDC 600 includes a first delay line 610, a second delay line 620 parallel with the first delay line 610, and comparators 630 coupled between the first delay line 610 and the second delay line 620.

The first delay line 610 includes first resistors (not shown) coupled in series, and the second delay line 620 includes second resistors (not shown) coupled in series. A resolution of the TDC 600 is determined according to resistances of the first and second resistors. A resistor of a small resistance is required to implement a TDC of high-resolution, and the resistor of the small resistance may be implemented by using metal lines and via plugs as described above. Connections of the first delay line 610, the second delay line 620, and the comparators 630 are identical to the connections illustrated in FIG. 3.

The comparators 630 compare first voltages of nodes of the first delay line 610 with second voltages of corresponding nodes of the second delay line 620. Each of the comparators 631, 632, and 633 is coupled between the first delay line 610 and the second delay line 620 with a symmetric configuration. The layout of a typical one of the comparators will be described below with reference to FIG. 7.

When a direction of inputting a first signal to the first delay line 610 is identical to a direction of inputting a second signal to the second delay line 620, each resistance of the first resistors may be R1 and each resistance of the second resistors may be R2, which is different from R1.

When the direction of inputting the first signal to the first delay line 610 is different from the direction of inputting a second signal to the second delay line 620, each resistance of the first resistors and second resistors is identical.

Figure 7:
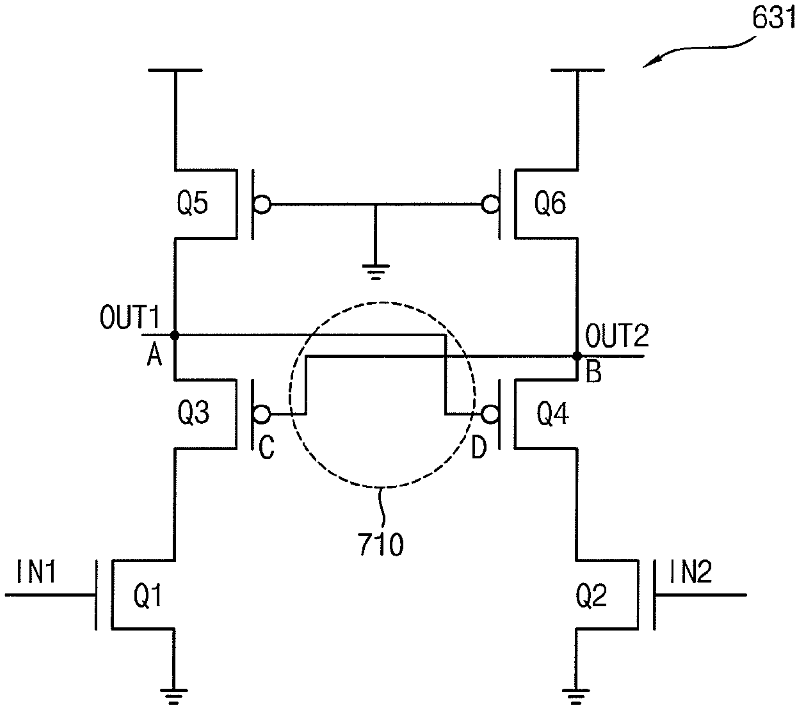
FIG. 7 is a circuit diagram illustrating a comparator shown in the layout of FIG. 6.

FIG. 7 is a circuit diagram illustrating a typical comparator shown in FIG. 6.

Referring to FIG. 7, gates, forming input terminals of the comparator 631, for example, of transistors Q1 and Q2 are respectively coupled to a node of the first delay line and a corresponding node of the second delay line, shown as IN1 and IN2, respectively, in FIG. 7. A voltage of the node of the first delay line is compared with a voltage of the corresponding node of the second delay line. A comparison result of the voltages of the two nodes is outputted through output terminals OUT1 and OUT2 of the comparator 631 at nodes A and B, respectively.

Figure 8A:
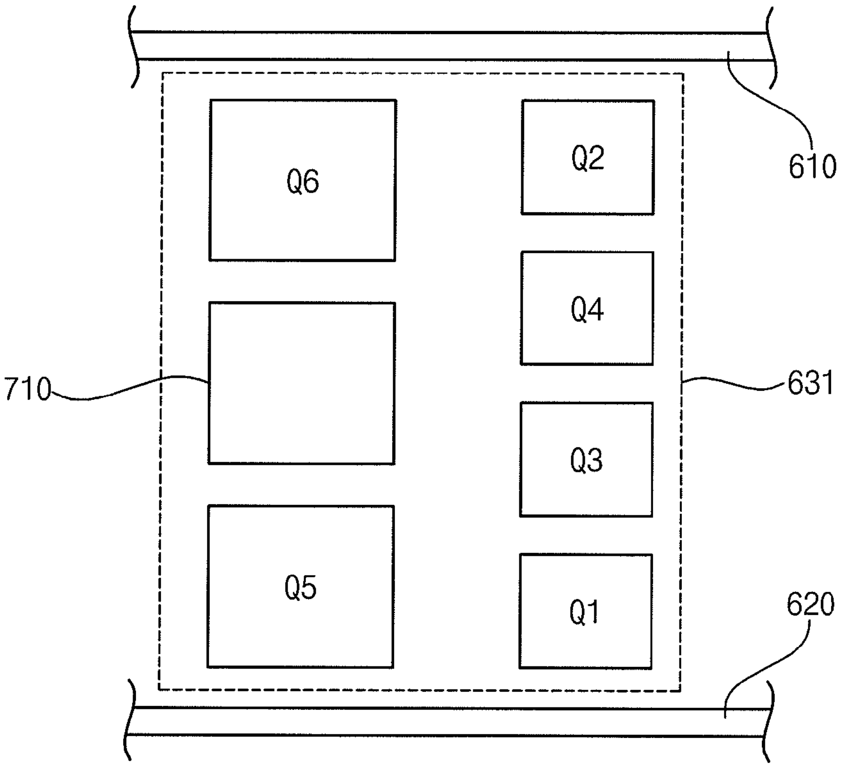
FIGS. 8A and 8B are diagrams illustrating a layout of a comparator shown in FIG. 7.
Figure 8B:
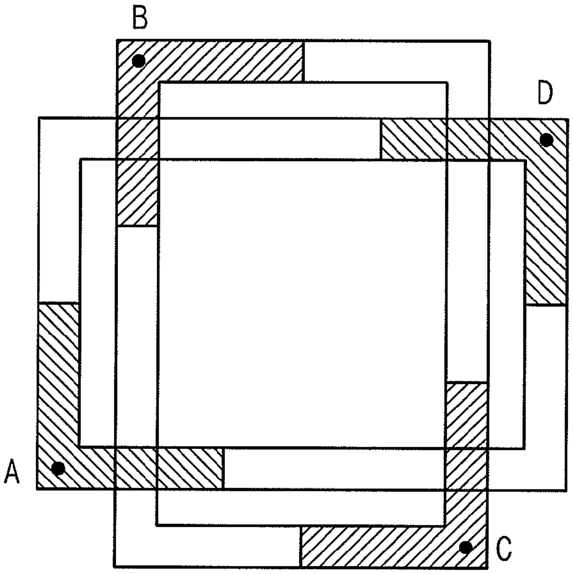

The output terminals OUT1 and OUT2 of the comparator 631 are also respectively coupled to gates D and C of transistors Q3 and Q4, and the comparator 631 may have a symmetry centered on a coupling part 710 as illustrated in FIGS. 8A and 8B.

FIGS. 8A and 8B are diagrams illustrating a layout of a comparator as shown in FIG. 7.

Referring to FIG. 8A, transistors Q1, Q2, Q3, Q4, Q5, and Q6 and the coupling part 710 have a symmetry with respect to the first and second delay lines 610 and 620.

As illustrated in FIG. 7, in the coupling part 710, a line from node A to gate D and a line from node B to gate C are crossed and the line from A to D is required to be electrically isolated from the line from B to C. That is, the line from A to D and the line from B to C are required to be implemented in different metal layers. In this exemplary embodiment, the coupling part 710 may not have the symmetry with respect to the first and second delay lines 610 and 620. FIG. 8B illustrates a case when the coupling part 710 has the symmetry with respect to the first and second delay lines 610 and 620.

Referring to FIG. 8B, in the coupling part 710, the line from A to D is formed with two lines not one line, as shown in FIG. 7, and the line from B to C is formed with two lines not one line, as shown in FIG. 7. In FIG. 8B, a line shaded area and an empty area represent metal lines disposed in metal layers different from each other. Thus, the lines can cross but are isolated from one another.

Figure 9A:
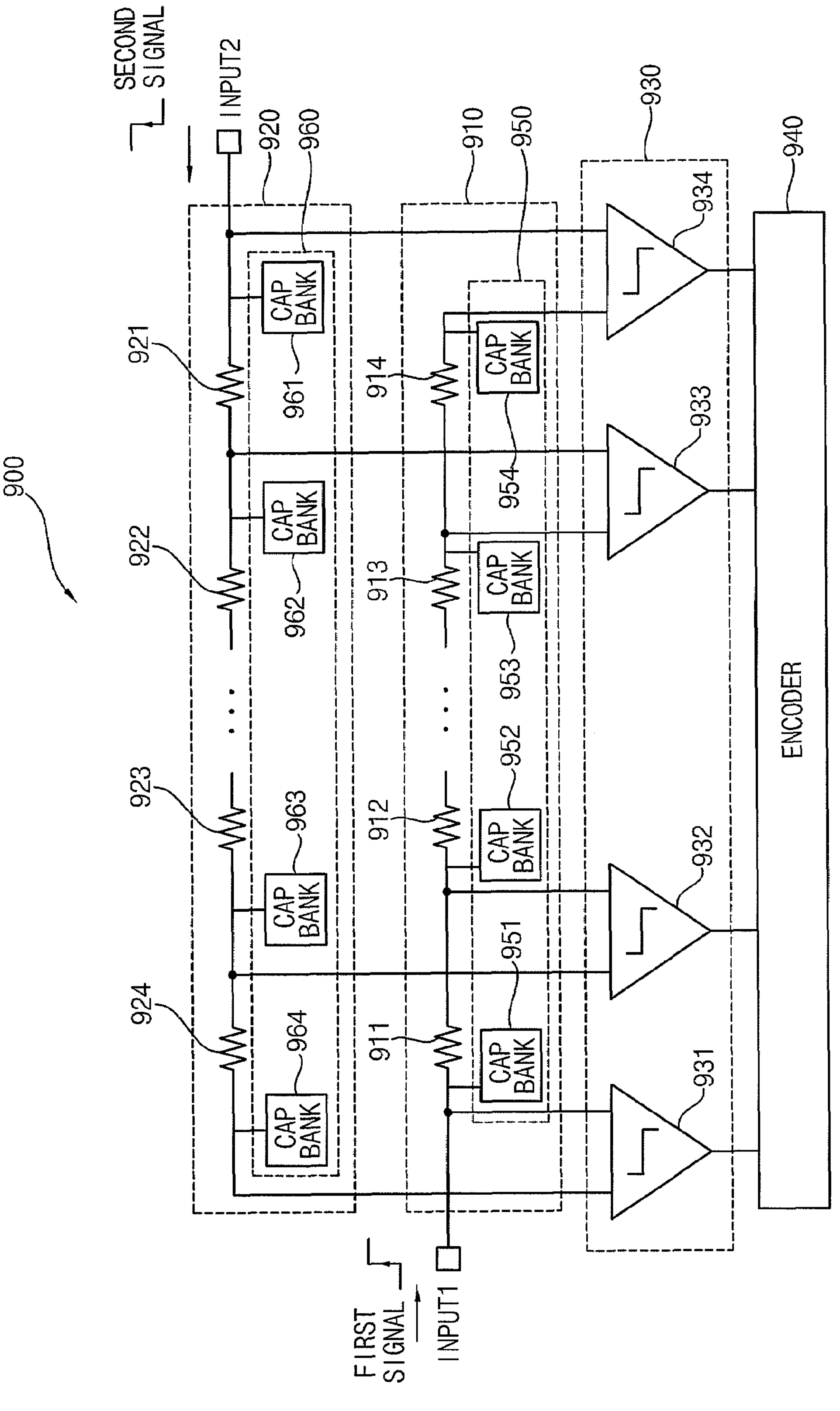
FIG. 9A is a diagram illustrating a high-resolution time-to-digital converter according to an exemplary embodiment of the present invention.

FIG. 9A is a diagram illustrating a high-resolution TDC according to an exemplary embodiment of the present invention.

The TDC 900 includes two delay lines 910 and 920, comparators 930 and an encoder 940. The delay lines 910 and 920 respectively include resistors.

A first signal INPUT1 is inputted to a start node of the first delay line 910 and is transmitted to an end node of the first delay line 910 through series-connected resistors 911, 912, 913, and 914. A second signal INPUT2 is inputted to a node of the second delay line 920 corresponding to the end node of the first delay line 910 and transmitted to a node of the second delay line 920 corresponding to the start node of the first delay line 910 through series-connected resistors 921, 922, 923, and 924.

Resistances of the resistors 911, 912, 913, and 914 of the first delay line 910 and the resistors 921, 922, 923, and 924 of the second delay line 920 are substantially identical to each other.

The comparators 930 compare first voltages of nodes of the first delay line 910 with second voltages of corresponding nodes of the second delay line 920. The comparator 931 compares a voltage of the start node of the first delay line 910 with a voltage of the end node of the second delay line 920, the comparator 932 compares a voltage of a node between the resistor 911 and the resistor 912 with a voltage of a node between the resistor 924 and the resistor 923, the comparator 933 compares a voltage of a node between the resistor 913 and the resistor 914 with a voltage of a node between the resistor 922 and the resistor 921, and the comparator 934 compares a voltage of the end node of the first delay line 910 with a voltage of a start node of the second delay line 920.

Outputs of the comparators 930 are provided to the encoder 940, and the encoder 940 generates a digital code corresponding to a delay time of the first signal and the second signal. For example, the encoder 940 may generate a binary code corresponding to the delay time of the first signal and the second signal as the digital code.

The resistances of the resistors of delay lines are usually about several ohms in order to provide a TDC having a resolution of about 1 picoseconds. When a TDC having a high-resolution is implemented, there is a limit on measuring a maximum time difference between two signals. Therefore, a maximum time difference between the two signals is required to be increased by lowering a resolution of a TDC according to the specific application. The TDC 900 in FIG. 9A controls a resolution by further including resolution control capacitor banks 950 and 960 respectively coupled to the first and second delay lines 910 and 920.

Figure 9B:
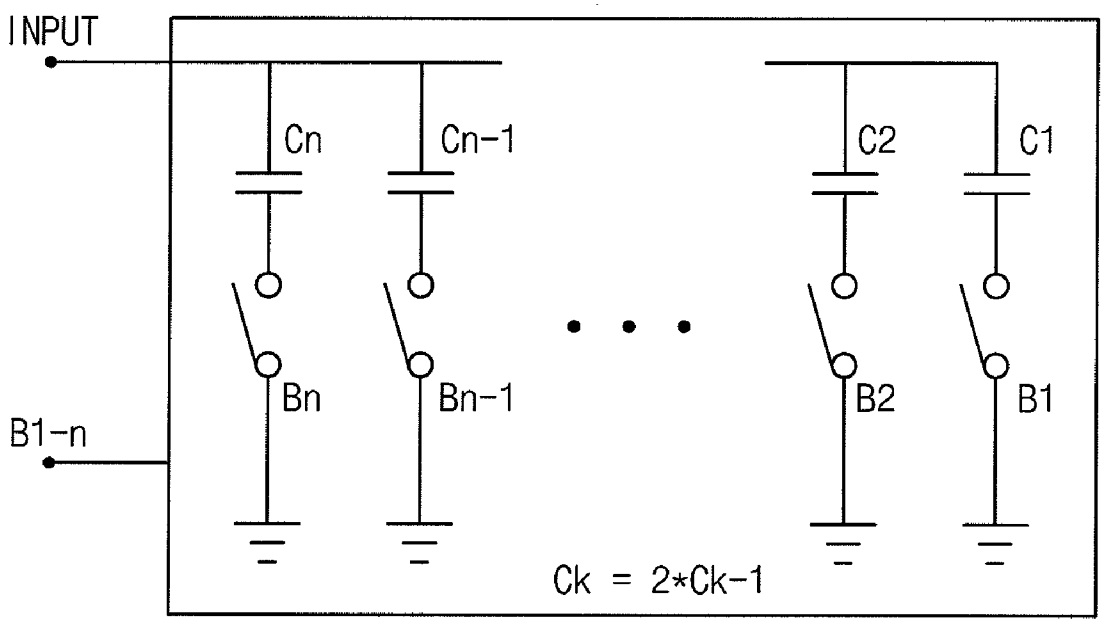
FIG. 9B is a diagram illustrating a configuration of a resolution control capacitor bank used in the converter shown in FIG. 9A.

FIG. 9B is a diagram illustrating a configuration of a resolution control capacitor bank as shown in FIG. 9A.

The resolution control capacitor bank includes a plurality of capacitance units coupled in parallel. Each capacitance unit includes a capacitor and a switch. A capacitance of the resolution control capacitor bank is determined according to the number of capacitance units having closed switches and the type of the capacitance units. A delay time between nodes may be changed based on the capacitance of the resolution control capacitor bank. A capacitance (Ck) of a K capacitance unit, where K is a natural number equal to or greater than 1, satisfies $Ck=2(K-1)*C1$, where C1 is a capacitance of a capacitor having a smallest capacitance in a first capacitance unit. The capacitance of the capacitor C1 having the smallest capacitance is larger than a capacitance measured from an input terminal of the comparator.

Each capacitance unit of the resolution control capacitor banks 950 and 960 is identical. That is, all resolution control capacitor banks 950 and 960 in the TDC 900 respectively have an identical capacitance determined by one resolution control signal (B1−n). The capacitors C1, C2, . . . Cn−1, Cn are connected in parallel to ground through respective switches B1, B2, . . . Bn−1, Bn, as shown in FIG. 9B.

Figure 10A:
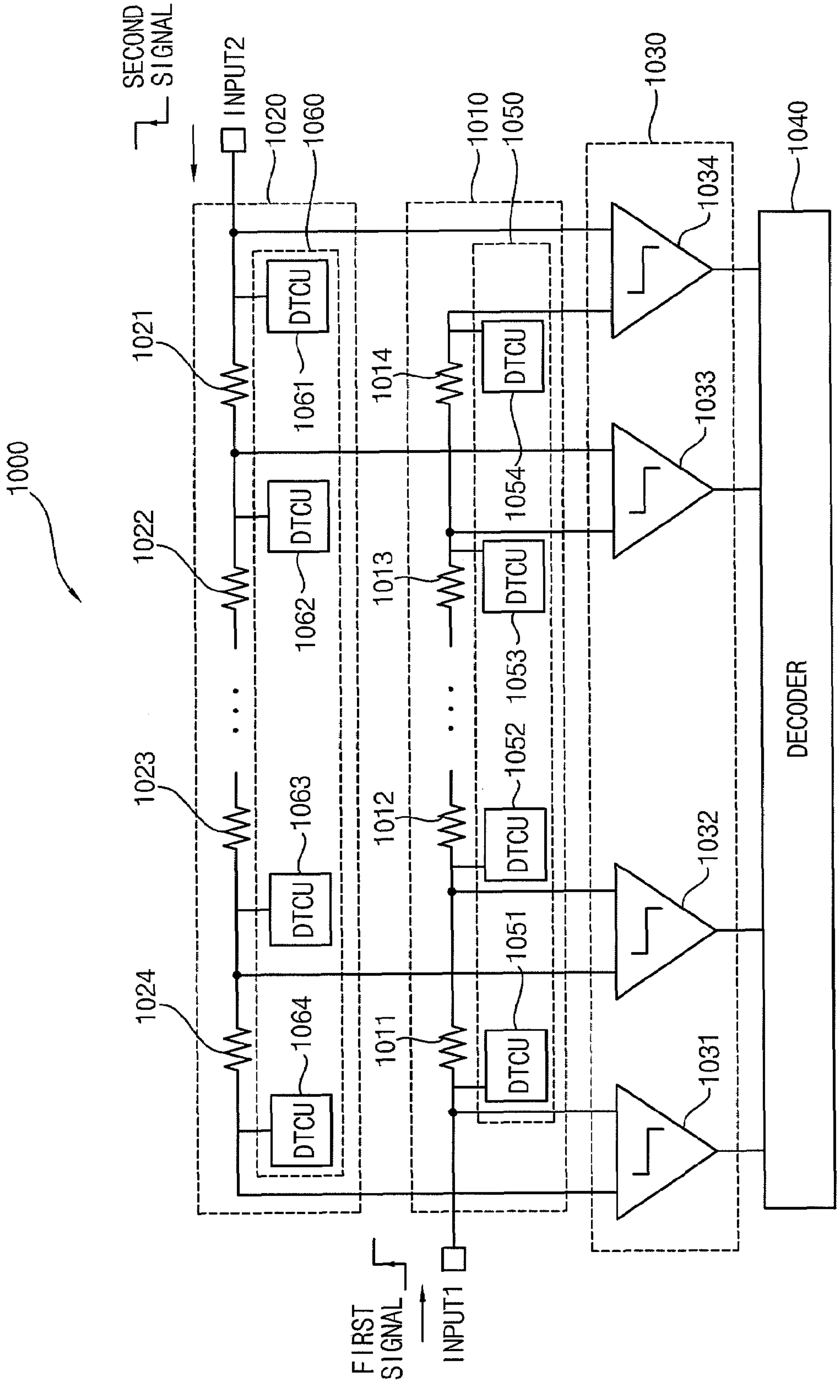
FIG. 10A is a diagram illustrating a high-resolution time-to-digital converter according to an exemplary embodiment of the present invention.

FIG. 10A is a diagram illustrating a high-resolution TDC according to an exemplary embodiment of the present invention.

The TDC 1000 includes two delay lines 1010 and 1020, comparators 1030, and an encoder 1040. The delay lines 1010 and 1020 include series-connected resistors.

A first signal INPUT1 is inputted to a start node of the first delay line 1010 and transmitted to an end node of the first delay line 1010 through resistors 1011, 1012, 1013, and 1014. A second signal INPUT2 is inputted to a node of the second delay line 1020 corresponding to the end node of the first delay line 1010 and transmitted to a node of the second delay line 1020 corresponding to the start node of the first delay line 1010 through resistors 1021, 1022, 1023, and 1024.

Resistance values of the resistors 1011, 1012, 1013, and 1014 of the first delay line 1010 and of the resistors 1021, 1022, 1023, and 1024 of the second delay line 1020 are substantially identical to each other.

The comparators 1030 compare first voltages of nodes of the first delay line 1010 with second voltages of corresponding nodes of the second delay line 1020. More specifically, the comparator 1031 compares a voltage of the start node of the first delay line 1010 with a voltage of an end node of the second delay line 1020, the comparator 1032 compares a voltage of a node between the resistor 1011 and the resistor 1012 with a voltage of a node between the resistor 1024 and the resistor 1023, the comparator 1033 compares a voltage of a node between the resistor 1013 and the resistor 1014 with a voltage of a node between the resistor 1022 and the resistor 1021, and the comparator 1034 compares a voltage of the end node of the first delay line 1010 with a voltage of a start node of the second delay line 1020.

Outputs of the comparators 1030 are provided to the encoder 1040, and the encoder 1040 generates a digital code corresponding to a delay time of the first signal and the second signal. For example, the encoder 1040 may generate a binary code corresponding to the delay time of the first signal and the second signal as the digital code.

The resistances of the resistors of the delay lines are respectively about several ohms so as to implement a TDC having a resolution not greater than about 1 picoseconds. When a TDC is implemented with a resistor of a small resistance, however, a tiny error of the resistor value may have an appreciable effect on the performance of the TDC.

The error of the resistor value described above may be compensated by using a capacitor. The TDC 1000 in FIG. 10A controls a resolution by further including delay time compensation units 1050 and 1060 respectively coupled to the first and second delay lines 1010 and 1020. Delay time compensation unit 1050 includes individual units DTCU 1051, 1052, 1053, and 1054 connected to the first delay line 1010 and individual units DTCU 1061, 1062, 1063, and 1064 connected to the second delay line 1020.

Figure 10B:
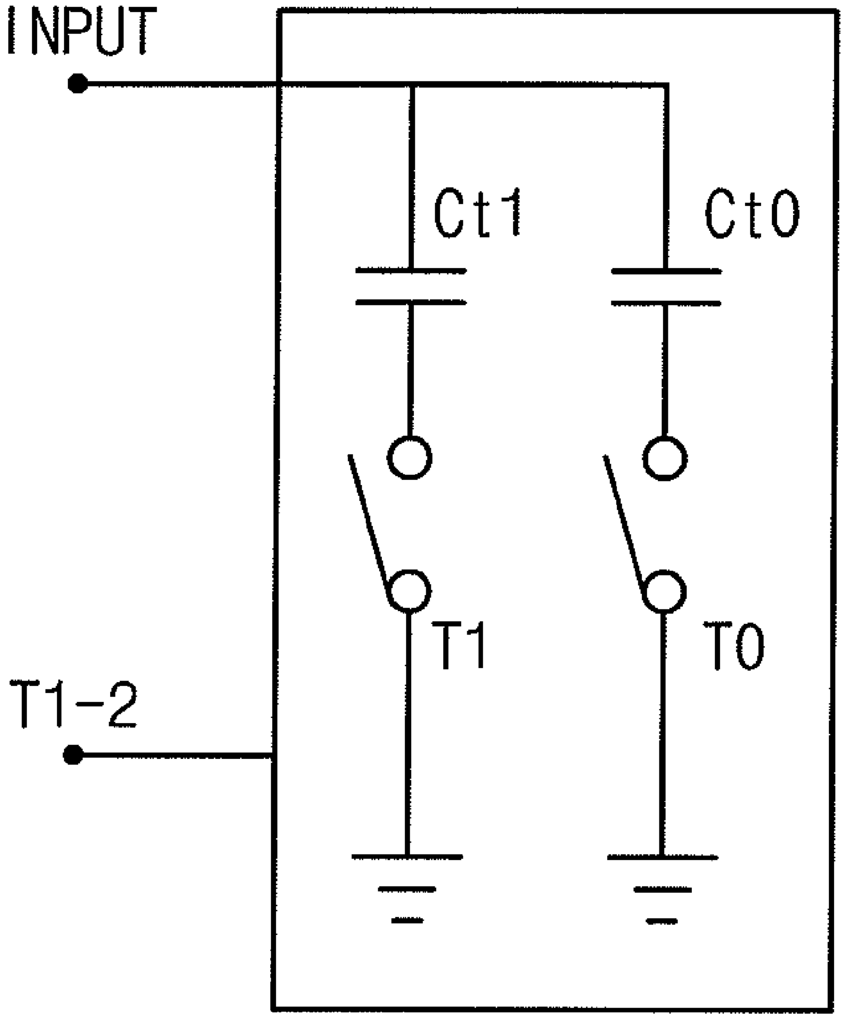
FIG. 10B is a diagram illustrating a configuration of a delay time compensation unit used in the converter shown in FIG. 10A.

FIG. 10B is a diagram illustrating a configuration of an individual delay time compensation unit, such as DTCU 1051, as shown in FIG. 10A.

The delay time compensation unit includes a plurality of capacitance units coupled in parallel like the capacitors in the resolution control capacitor bank shown in FIG. 9B. Each capacitance unit respectively includes a capacitor and a switch. A capacitance of the delay time compensation unit is determined according to the number of capacitance units that have closed switches and the type of the capacitance units. The capacitance values of a capacitor Ct0 and a capacitor Ct1 in the delay time compensation unit are much smaller than the capacitance measured from an input terminal of the comparator.

The capacitance of the delay time compensation unit in the TDC 1000 is determined by a control signal T1-2 that is independently externally provided to the delay time compensation unit and that controls switches T1 and T0 to change the overall capacitance of the delay time compensation unit DTCU by connecting the capacitors to ground. Therefore, capacitances of the delay time compensation units 1150 and 1160 in the TDC 1000 may be different from each other depending on the control signals fed thereto.

Because the TDC shown in FIG. 9A and the TDC shown in FIG. 10A are exemplary embodiments of the present invention, it will be understood by those of ordinary skill in the art that a TDC may include both the resolution control capacitor banks and the delay time compensation units.

Figure 11:
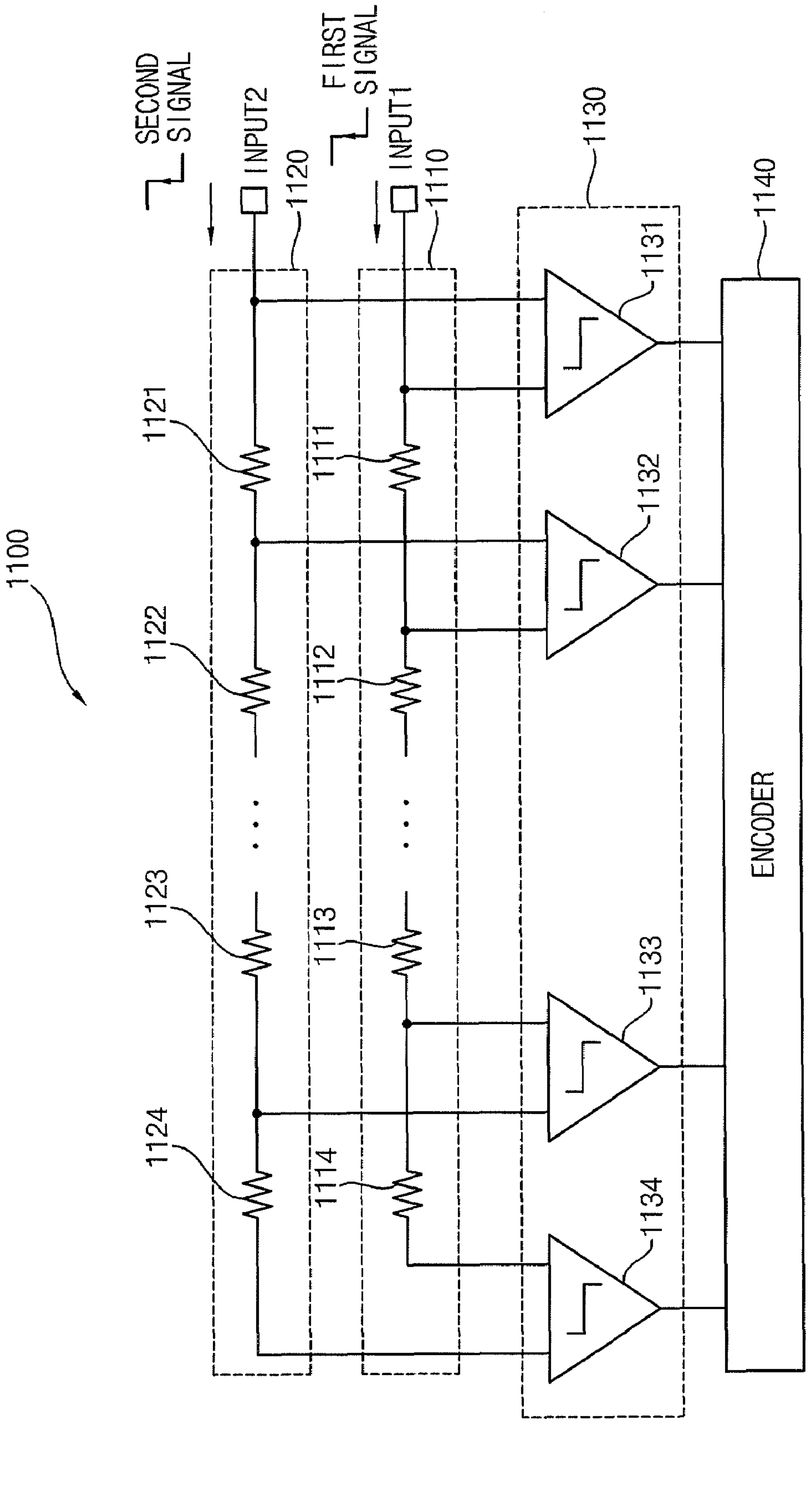
FIG. 11 is a diagram illustrating a high-resolution time-to-digital converter according to an exemplary embodiment of the present invention.

FIG. 11 is a diagram illustrating a high-resolution TDC according to an exemplary embodiment of the present invention.

In the TDC illustrated in FIG. 3, the direction of inputting a first signal to a first delay line is different from the direction of inputting a second signal to a second delay line, because of a delay time difference between nodes. A TDC may, however, receive a first signal in a direction identical to a direction of receiving a second signal.

The TDC 1100 includes two delay lines 1110 and 1120, comparators 1130, and an encoder 1140 as in the TDC shown in FIG. 3. The delay lines 1110 and 1120 respectively include series-connected resistors. In the TDC 1100 of FIG. 11, however, a direction of inputting a first signal is identical to a direction of inputting a second signal, unlike what was shown in the TDC 300 of FIG. 3. The first signal INPUT1 is inputted to a start node of the first delay line 1110 and transmitted to an end node of the first delay line 1110 through resistors 1111, 1112, 1113, and 1114. The second signal INPUT2 is inputted to a node of the second delay line 1120 corresponding to the start node of the first delay line 1110 and transmitted to a node of the second delay line 1120 corresponding to the end node of the first delay line 1110 through resistors 1121, 1122, 1123, and 1124. Each resistance value of the resistors 1111, 1112, 1113, and 1114 of the first delay line 1110 is R1, and each resistance value of the resistors 1121, 1122, 1123, and 1124 is R2, which is different from R1.

The comparators 1130 compare first voltages of the nodes of the first delay line 1110 with second voltages of corresponding nodes of the second delay line 1120. The comparator 1131 compares a voltage of the start node of the first delay line 1110 with a voltage of a start node of the second delay line 1120, the comparator 1132 compares a voltage of a node between the resistor 1111 and the resistor 1112 with a voltage of a node between the resistor 1121 and the resistor 1122, the comparator 1133 compares a voltage of a node between the resistor 1113 and the resistor 1114 with a voltage of a node between the resistor 1123 and the resistor 1124, and the comparator 1134 compares a voltage of the end node of the first line 1010 with a voltage of a end node of the second delay line 1120.

Outputs of the comparators 1130 are provided to the encoder 1140, and the encoder 1140 generates a digital code corresponding to a delay time of the first signal and the second signal. For example, the encoder 1140 may generate a binary code corresponding to the delay time of the first signal and the second signal as the digital code.

The TDC 1100 uses resistors respectively having values of about several ohms, so as to implement a resolution not greater than about 1 picosecond as in the TDC 300 shown in FIG. 3. The resistors respectively having about several ohms may be implemented by using metal lines and via plugs. The TDC 1100 may further include resolution control capacitor banks or/and delay time compensation units, as in the TDC 900 shown in FIG. 9A and the TDC 1000 shown in FIG. 10A.

The following table illustrates a comparison of performances between a TDC including a resolution control capacitor bank according to an exemplary embodiment of the present invention and conventional time-to-digital converters (TDCs).

| | Embodiment of the present invention | Nose 2006 ISSCC[1] | Staszewski 2005 RFIC[2] | Jansson 2006 JSSC[3] |
|---|---|---|---|---|
| Process | 0.13 um | 90 nm | 90 nm | 0.35 um |
| Technique | RC DL | Vernier DL | Pseudo-diff DL | Interpolator |
| Resolution | 0.88~8.8 ps | 1 ps | 17~21 ps | 12.2 ps |
| No. of bins | 32 | 16 | 48 | |
| Power (mW) | 1.7 | N.A. | 6.9/1.8 | 40 |
| Area ($mm^2$) | 0.027 (Core: 0.005) | 0.24 | 0.01 | >1 |

[1]K. Nose, M. Kajita, M. Mizuno, A 1 ps-Resolution Jitter-Measurement Macro Using Interpolated Jitter Oversampling, IEEE International Solid-State Circuits Conference, 2006

[2]Robert Bogdan Staszewski, Sudheer Vemulapalli, Prasant Vallur, John Wallberg, and Poras T. Balsara, Time-to-Digital Converter for RF Frequency Synthesis in 90 nm CMOS, IEEE Radio Frequency Integrated Circuits Symposium, 2005

[3]J. Jansson et al., A CMOS Time-to-Digital Converter With Better Than 10 ps Single-Shot Precision. IEEE JOURNAL OF SOLID-STATE CIRCUITS, VOL. 41, NO. 6, JUNE 2006

As illustrated in the table set forth hereinabove, the TDC according to exemplary embodiments of the present invention may be implemented with smaller size and smaller power than the conventional TDCs.

Also, the TDC according to exemplary embodiments of the present invention may control a resolution from about 1 picoseconds to about 9 picoseconds.

The desirable effects described above may be obtained because the TDC according to exemplary embodiments of the present invention includes resolution control capacitor banks and resistors respectively having small resistance.

Having thus described exemplary embodiments of the present invention, it is to be understood that the invention defined by the appended claims is not to be limited by particular details set forth in the above description as many apparent variations thereof are possible without departing from the spirit or scope thereof as hereinafter claimed.

What is claimed is:

1. A time-to-digital converter comprising:

a first delay line including first resistors coupled in series and receiving a first signal through a start node thereof;

a second delay line including second resistors coupled in series and receiving a second signal through a node thereof corresponding to an end node of the first delay line;

comparators configured to compare first voltages of nodes of the first delay line with second voltages of corresponding nodes of the second delay line; and an encoder configured to generate a digital code based on outputs of the comparators.

2. The time-to-digital converter of claim 1, wherein resistance values of the first resistors and the second resistors are substantially identical to each other.

3. The time-to-digital converter of claim 2, wherein the first resistors and the second resistors are implemented with metal lines and via plugs.

4. The time-to-digital converter of claim 2, wherein the first resistors and the second resistors are implemented with polysilicon resistors coupled in parallel.

5. The time-to-digital converter of claim 2, wherein each resistance value of the first resistors and second resistors corresponds to about several ohms.

6. The time-to-digital converter of claim 1, further comprising:

a shielding line configured to protect the first delay line and the second delay line from noise.

7. The time-to-digital converter of claim 1, wherein resolution control capacitor banks are respectively coupled to the nodes of the first delay line and the second delay line.

8. The time-to-digital converter of claim 7, wherein each resolution control capacitor bank includes first through N-th capacitance units coupled in parallel, each of the capacitance units including a capacitor and a switch.

9. The time-to-digital converter of claim 8, wherein a capacitance (Ck) of a capacitor in a K-th capacitance unit satisfies Ck=2(K−1)*C1, where K is a natural number equal to or greater than 1 and equal to or less than N, and C1 corresponds to a capacitance of a capacitor in a first capacitance unit.

10. The time-to-digital converter of claim 1, wherein delay time compensation units are respectively coupled to at least a portion of the nodes of the first and second delay lines, the delay time compensation unit configured to compensate an unbalance of a delay time between the nodes.

11. The time-to-digital converter of claim 10, wherein the delay time compensation unit includes one or more capacitors and one or more switches.

12. The time-to-digital converter of claim 10, wherein resolution control capacitor banks are respectively coupled to the nodes of the first delay line and the second delay line.

13. A time-to-digital converter comprising:

a first delay line including first resistors coupled in series and receiving a first signal through a start node thereof;

a second delay line including second resistors coupled in series and receiving a second signal through a node thereof corresponding to the start node;

comparators configured to compare first voltages of nodes of the first delay line with second voltages of corresponding nodes of the second delay line; and an encoder configured to generate a digital code based on outputs of the comparators.

14. The time-to-digital converter of claim 13, wherein each resistance of the first resistors corresponds to a first value, and each resistance of the second resistors corresponds to a second value different from the first value.

15. The time-to-digital converter of claim 14, wherein the first resistors and the second resistors are implemented with metal lines and contact plugs.

16. The time-to-digital converter of claim 14, wherein each resistance value of the first resistors and the second resistors corresponds to about several ohms.

17. The time-to-digital converter of claim 13, wherein resolution control capacitor banks are respectively coupled to the nodes of the first delay line and the second delay line.

18. The time-to-digital converter of claim 17, wherein the capacitor bank includes first through N-th capacitance units coupled in parallel, each of the capacitance unit including a capacitor and a switch.

19. The time-to-digital converter of claim 18, wherein a capacitance (Ck) of a capacitor in a K-th capacitance unit satisfies Ck=2(K−1)*C1, where K is a natural number equal to or greater than 1 and equal to or less than N and C1 corresponds to a capacitance of a capacitor in a first capacitance unit.

20. The time-to-digital converter of claim 13, wherein delay time compensation units are respectively coupled to at least a portion of the nodes of the first and second delay lines, the delay time compensation unit configured to compensate an unbalance of the delay time between the nodes.

21. The time-to-digital converter of claim 20, wherein the delay time compensation unit includes one or more capacitors and one or more switches.

22. The time-to-digital converter of claim 20, wherein resolution control capacitor banks are respectively coupled to the nodes of the first and second delay lines, wherein the capacitor banks are configured to control a resolution of the converter.

23. A time-to-digital converter comprising:

a first delay line including first resistors coupled in series and transmitting a first signal;

a second delay line including second resistors coupled in series and transmitting a second signal;

comparators coupled between the first delay line and the second delay line, and configured to compare first voltages of nodes of the first delay line with second voltages of corresponding nodes of the second delay line; and an encoder configured to generate a digital code based on outputs of the comparators.

24. The time-to-digital converter of claim 23, wherein a layout of each of the comparators has a symmetry with respect to the first delay line and the second delay line.

25. The time-to-digital converter of claim 23, wherein the first delay line receives the first signal through a start node, and the second delay line receives the second signal through a node corresponding to an end node of the first delay line.

26. The time-to-digital converter of claim 25, wherein resistance values of the first resistors and the second resistors are substantially identical to each other.

27. The time-to-digital converter of claim 23, wherein the first delay line receives the first signal through a start node, and the second delay line receives the second signal through a node corresponding to the start node of the first delay line.

28. The time-to-digital converter of claim 27, wherein each resistance of the first resistors corresponds to a first value, and each resistance of the second resistors corresponds to a second value different from the first value.

29. The time-to-digital converter of claim 23, wherein the first resistors and the second resistors are implemented with metal lines and via plugs.

30. The time-to-digital converter of claim 23, wherein the first resistors and the second resistors are implemented with poly-silicon resistors coupled in parallel.

31. The time-to-digital converter of claim 23, wherein each resistance value of the first resistors and the second resistors corresponds to about several ohms.

32. The time-to-digital converter of claim 23, further comprising:

a shielding line configured to protect the first delay line and the second delay line from noise.

33. The time-to-digital converter of claim 23, wherein resolution control capacitor banks are respectively coupled to nodes of the first delay line and the second delay line.

34. The time-to-digital converter of claim 33, wherein each capacitor bank includes first through N-th capacitance units coupled in parallel, each of the capacitance unit including a capacitor and a switch.

35. The time-to-digital converter of claim 34, wherein a capacitance (Ck) of a capacitor in a K-th capacitance unit satisfies $Ck=2(K-1)*C\mathbf{1}$, where K is a natural number equal to or greater than 1 and equal to or less than N, and C1 corresponds to a capacitance of a capacitor in a first capacitance unit.

36. The time-to-digital converter of claim 23, wherein delay time compensation units are respectively coupled to at least a portion of nodes of the first and second delay lines, the delay time compensation unit configured to compensate an unbalance of a delay time between the nodes.

37. The time-to-digital converter of claim 36, wherein the delay time compensation unit includes one or more capacitors and one or more switches.

38. The time-to-digital converter of claim 36, wherein resolution control capacitor banks are respectively coupled to the nodes of the first delay line and the second delay line.

* * * * *